United States Patent [19]

Grishakov et al.

[11] Patent Number: 5,731,724

[45] Date of Patent: Mar. 24, 1998

[54] POWER SHORT PULSE GENERATOR HAVING AN INPUT DELAY AND A FEEDBACK DELAY IN GENERATING THE OUTPUT PULSE

[75] Inventors: Gennady Ivanovich Grishakov; Igor Vladimirovich Tarasov, both of Moscow, Russian Federation

[73] Assignee: Sun Microsystems, Inc., Mountain View, Calif.

[21] Appl. No.: 638,920

[22] Filed: Apr. 25, 1996

[51] Int. Cl.$^6$ ............................................. H03K 3/033
[52] U.S. Cl. ..................... 327/227; 327/230; 327/164; 327/263; 327/264; 327/398; 327/400
[58] Field of Search .......................... 327/24, 164, 165, 327/172, 263, 264, 285, 398, 399, 400, 227, 230

[56] References Cited

U.S. PATENT DOCUMENTS

| | | | |
|---|---|---|---|
| 4,141,033 | 2/1979 | De Boer | 327/165 |
| 4,757,214 | 7/1988 | Kobayashi | 327/263 |
| 5,243,637 | 9/1993 | Flaherty et al. | 327/165 |
| 5,498,989 | 3/1996 | Diba | 327/230 |
| 5,614,845 | 3/1997 | Masleid | 326/93 |

Primary Examiner—Timothy P. Callahan
Assistant Examiner—Jung Ho Kim
Attorney, Agent, or Firm—D'Alessandro & Ritchie

[57] ABSTRACT

A power short pulse generator for generating a pulse on a rising edge and falling edge of an input signal according to the present invention comprises an input node for receiving the input signal and an output node for supplying an output signal. A first pulldown circuit and a second pulldown circuit are connected in series between the output node and a first supply voltage potential, the first pulldown circuit and the second pulldown circuit each having an input. A third pulldown circuit and a fourth pulldown circuit are connected in series between the output node and the first supply voltage potential, the third pulldown circuit and the fourth pulldown circuit each having an input. A pullup circuit is connected between the output node and a second supply voltage potential, the pullup circuit having an input. A leakage current circuit is connected between the output node and the second supply voltage potential. A feedback delay circuit has a feedback circuit input connected to the output node and a feedback circuit output connected to the input of the pullup circuit. A first input delay circuit is connected between the input node and the input of the first pulldown circuit and the second pulldown circuit. A second input delay circuit is connected between the input node and the input of the third pulldown circuit and the fourth pulldown circuit.

73 Claims, 2 Drawing Sheets

5,731,724

POWER SHORT PULSE GENERATOR HAVING AN INPUT DELAY AND A FEEDBACK DELAY IN GENERATING THE OUTPUT PULSE

BACKGROUND OF THE INVENTION

1. Field Of The Invention

The present invention relates to logic circuits that transform input swings of different polarities into single-polarity short pulses. More particularly, the present invention relates to short pulse generators.

2. The Prior Art

Logic circuits that are used to transform input voltage swings of different polarities into single-polarity short pulses are often used to construct short pulse generators. In order to drive high-capacitance loads, a chain of scaled inverters is connected to the output of a logic circuit.

Such generators typically exhibit one or more of several shortcomings. Because of the large capacitances which must be charged and discharged in P-Channel MOS transistors, it is difficult to obtain extremely short output pulses. Because these large capacitances exist in the P-Channel MOS transistors in all stages of such circuits, it is difficult to provide these circuits with short propagation delays therethrough. In addition, because of the unequal response of a CMOS logic circuit to positive and negative voltage input swings, it is difficult to obtain short pulses having equal amplitudes and widths from rising and falling input signals.

BRIEF DESCRIPTION OF THE INVENTION

A power short pulse generator for generating a pulse on a rising edge and falling edge of an input signal according to the present invention comprises an input node for receiving the input signal and an output node for supplying an output signal. A first pulldown circuit and a second pulldown circuit are connected in series between the output node and a first supply voltage potential, the first pulldown circuit and the second pulldown circuit each having an input. A third pulldown circuit and a fourth pulldown circuit are connected in series between the output node and the first supply voltage potential, the third pulldown circuit and the fourth pulldown circuit each having an input. A pullup circuit is connected between the output node and a second supply voltage potential, the pullup circuit having an input. A leakage current circuit is connected between the output node and the second supply voltage potential. A feedback delay circuit has a feedback circuit input connected to the output node and a feedback circuit output connected to the input of the pullup circuit. A first input delay circuit is connected between the input node and the input of the first pulldown circuit and the second pulldown circuit. A second input delay circuit is connected between the input node and the input of the third pulldown circuit and the fourth pulldown circuit.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
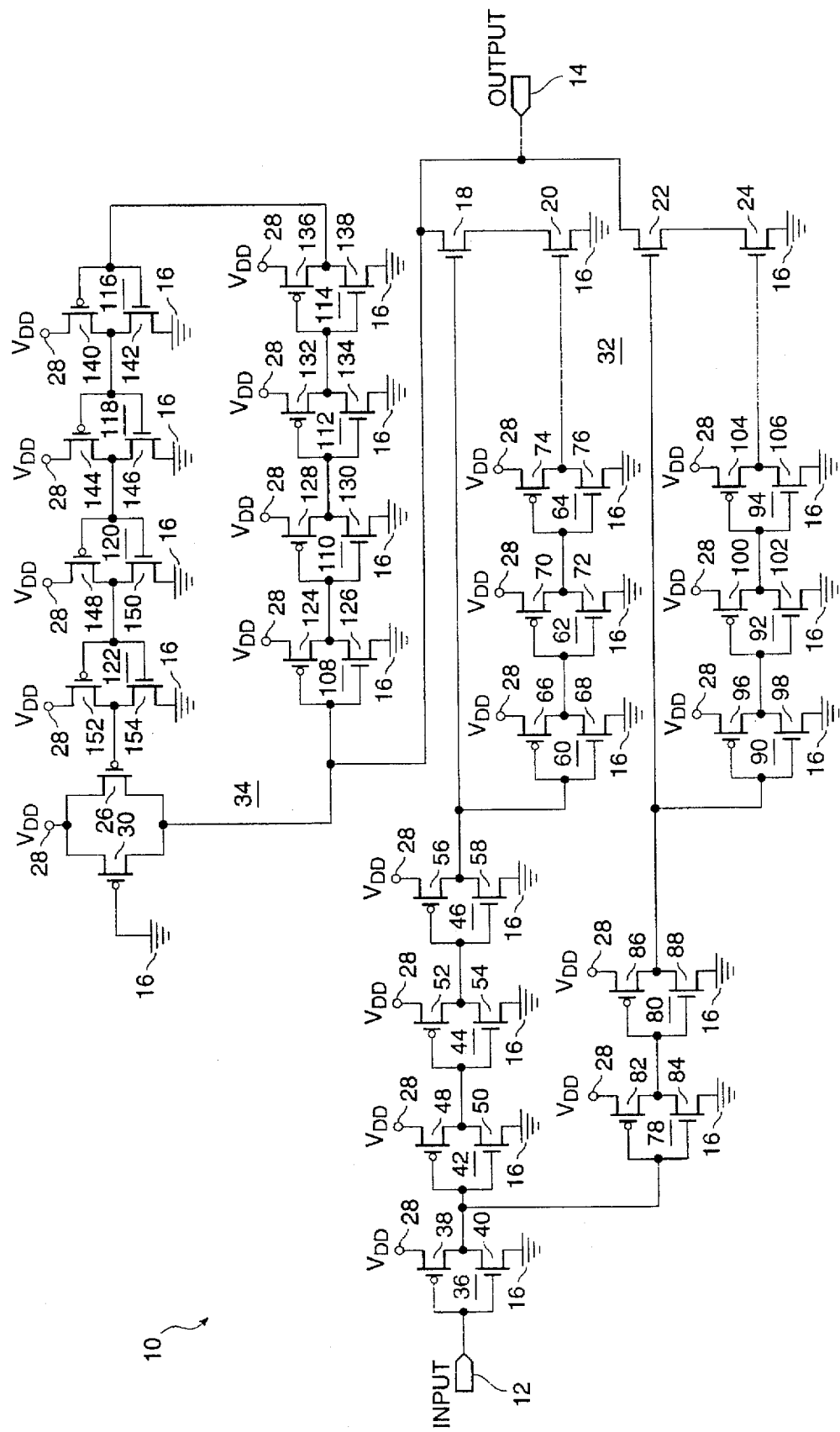
FIG. 1 is a schematic diagram of a presently preferred embodiment of a power short pulse generator according to the present invention.

Referring first to FIG. 1, a high current short pulse generator 10 includes an input node 12 and an output node 14. A first pair of N-Channel pulldown transistors is connected in series between output node 14 and a first supply voltage potential 16 such as ground. N-Channel pulldown transistor 18 has its drain connected to output node 14 and its source connected to the drain of N-Channel pulldown transistor 20. The source of N-Channel pulldown transistor 20 is connected to the first supply voltage potential 16.

A second pair of N-Channel pulldown transistors is also connected in series between output node 14 and the first supply voltage potential 16. N-Channel pulldown transistor 22 has its drain connected to output node 14 and its source connected to the drain of N-Channel pulldown transistor 24. The source of N-Channel pulldown transistor 24 is connected to the first supply voltage potential 16.

A P-Channel pullup transistor 26 has its drain connected to output node 14 and its source connected to second supply voltage potential VDD (shown at reference numeral 28), today typically five volts. A weak P-Channel transistor 30 is also connected between the output node 14 and the second supply voltage potential 28, and has its gate connected to first supply voltage potential 16.

The first and second pairs of N-Channel pulldown transistors 18, 20, 22, and 24 are driven from an input circuit 32 connected to input node 12. The P-Channel pullup transistor 26 is driven from a feedback circuit 34 connected to output node 14.

The input circuit 32 is driven from input node 12. Input node 12 drives an inverter 36 comprising P-Channel transistor 38 and N-Channel transistor 40. The output of the inverter 36 drives three cascaded inverters 42, 44, and 46, comprising P-Channel/N-Channel transistor pairs 48-50, 52-54, and 56-58. The output of inverter 46 drives the gate of N-Channel pulldown transistor 18. The output of inverter 46 also drives three cascaded inverters 60, 62, and 64, comprising P-Channel/N-Channel transistor pairs 66-68, 70-72, and 74-76. The output of inverter 64 drives the gate of N-Channel pulldown transistor 20.

The output of the inverter 36 also drives cascaded inverters 78 and 80, comprising P-Channel/N-Channel transistor pairs 82-84, and 86-88. The output of inverter 80 drives the gate of N-Channel pulldown transistor 22. The output of inverter 80 also drives cascaded inverters 90, 92, and 94, comprising P-Channel/N-Channel transistor pairs 96-98, 100-102, and 104-106. The output of inverter 94 drives the gate of N-Channel pulldown transistor 24.

The feedback circuit 34 is driven from output node 14 and comprises an even number of inverters. In the embodiment of FIG. 1, eight cascaded inverters 108, 110, 112, 114, 116, 118, 120, and 122 (comprising P-Channel/N-Channel transistor pairs 124-126, 128-130, 132-134, 136-138, 140-142, 144-146, 148-150, and 152-154) are employed. The output of the last inverter (122 in the embodiment of FIG. 1) drives the gate of P-Channel pullup transistor 26.

The output pulse width is controlled by the number of inverters in the feedback circuit. While the illustrative embodiment of the present invention is shown including eight inverters in the feedback circuit, it has been verified that the circuit of FIG. 1 functions satisfactorily with as few as two inverters in the feedback circuit 34.

There are two conditions to consider when analyzing the operation of the high current pulse generator circuit 10 of the present invention. The first is the condition when the input signal makes a transition from a low logic level to a high logic level and the second is the condition when the input signal makes a transition from a high logic level to a low logic level.

Figure 2:
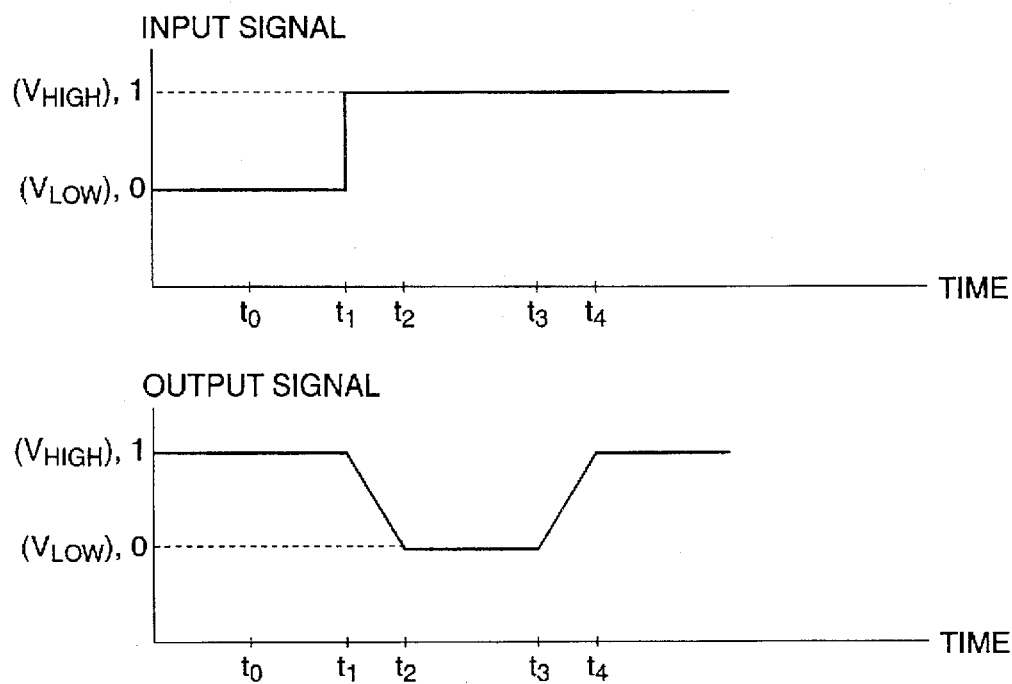
FIG. 2 is a timing diagram of the operation of the circuit of FIG. 1 when the input signal makes a transition from a low logic level to a high logic level.

Referring now to FIG. 2, a timing diagram will be useful when analyzing the operation of pulse generator circuit 10 as the input signal to input node 12 changes from a low logic level to a high logic level. During an initial steady state time period t0 where the input signal to input node 12 is a low logic level, the output signal of inverter 46 is also a low logic level because it has passed through an even number of inverters (the four inverters including 36, 42, 44, and 46). Since inverter 46 is driving a low logic level output into the gate of N-Channel pulldown transistor 18, N-Channel pulldown transistor 18 is switched off during this initial steady state period.

During this same steady state time period t0, the output signal of inverter 64 is a high logic level, since it has passed through an odd number of inverters (the seven inverters including 36, 42, 44, 46, 60, 62, and 64). Since inverter 64 is driving a high logic level output into the gate of N-Channel pulldown transistor 20, N-Channel pulldown transistor 20 is switched on during this initial steady state time period t0.

During time period t0, the output signal of inverter 80 is a high logic level, since it has passed through an odd number of inverters (the three inverters including 36, 78, and 80). Since inverter 80 is driving a high logic level output into the gate of N-Channel pulldown transistor 22, N-Channel pulldown transistor 22 is switched on during this initial steady state period.

In addition, during time period t0, the output signal of inverter 94 is a low logic level, since it has passed through an even number of inverters (the six inverters including 36, 78, 80, 90, 92, and 94). Since inverter 94 is driving a low logic level output into the gate of N-Channel pulldown transistor 24, N-Channel pulldown transistor 24 is switched off during this initial steady state period.

The inverter circuits connected between input node 12 and N-Channel pulldown transistors 18, 20, 22, and 24, have a small fan-out factor, to avoid the increase of signal edges of signals driven into the gates of N-Channel pulldown transistors 18, 20, 22, and 24. This will be appreciated by those of ordinary skill in the art.

During this initial steady state time period t0 where the input signal to input node 12 is a low logic level, P-Channel leakage transistor 30 provides a leakage current for charging the output capacitance load (at output node 14) to a high logic level voltage output. P-Channel leakage transistor 30 is a weak device and small in comparison with P-Channel pullup transistor 26 and N-Channel pulldown transistors 18, 20, 22 and 24. For example, the channel width of P-Channel leakage transistor 30 may be about 3 microns, while the channel widths of P-Channel pullup transistor 26 and N-Channel pulldown transistor 18 may be about 90 microns and about 45 microns, respectively. Therefore, P-Channel leakage transistor 30 may be easily overcome by the N-Channel pulldown transistors 18 and 20 or 22 and 24.

Since the output node 14 is driving a high logic level signal into the input of feedback circuit 34, feedback circuit 34 also has a high logic level output because it contains an even number of inverters. While eight inverters are shown in feedback circuit 34, those of ordinary skill in the art will recognize that the feedback delay can be either increased or decreased by adding or subtracting inverter pairs. Since the high logic level output of feedback circuit 34 is driven into the gate of P-Channel pullup transistor 26, P-Channel pullup transistor 26 is switched off during this initial steady state time period t0.

During a succeeding time period t1 occurring after initial steady state time period t0, a high logic level signal may be driven into input node 12 (see FIG. 2). This high logic level input signal propagates through the inverters driving N-Channel pulldown transistors 18, 20, 22, and 24. This signal first appears as a low logic signal at the output of inverter 80 after three inverter delays, where it switches off N-Channel pulldown transistor 22. After one inverter delay, the signal next appears at the output of inverter 46 as a high logic level signal, where it switches on N-Channel pulldown transistor 18. N-Channel pulldown transistor 20 continues to be switched on during time period t1, since the high logic level input signal driven into input node 12 is delayed by the additional three cascaded inverters 60, 62, and 64. N-Channel pulldown transistor 24 continues to be switched off during time period t1, since the high logic level input signal driven into input node 12 is delayed by cascaded inverters 90, 92, and 94.

Since N-Channel pulldown transistors 22 and 24 are switched off during time period t1, there is an open circuit disconnecting the series connected N-Channel pulldown transistors 22 and 24 from output node 14. However, since N-Channel pulldown transistors 18 and 20 are both switched on during time period t1, current conductance can occur from output node 14 to first supply voltage potential 16 (ground in FIG. 1), via the series connected N-Channel pulldown transistors 18 and 20. During time period t1, current is discharged through N-Channel pulldown transistors 18 and from the capacitance load at output node 14. The capacitance load current discharge through N-Channel pulldown transistors 18 and 20 causes the output node 14 voltage to decrease to a low logic level.

At a subsequent time period t2 occurring three inverter delays after the output of inverter 46 goes to a high logic level, N-Channel pulldown transistor 20 is switched off, since the high logic level signal driven into input node 12 at time t1 would have reached the output of inverter 64 and gate of N-channel pulldown transistor 20 as a low logic level signal. Thus the time interval for the capacitive load discharge at output node 14 is dependent on the time delay caused by cascaded inverters 60, 62, and 64. Persons of ordinary skill in the art will recognize that the time interval for the discharge of the capacitive load at output node 14 can be lengthened or shortened by adding or subtracting inverter pairs.

During time period t2 when the voltage of the capacitive load is at a low logic level, the input signal into feedback circuit 34 is also at a low logic level because the feedback signal is delayed by eight inverter delays after N-Channel pulldown transistor 18 has turned on. P-Channel pullup transistor 26 will switch on at a subsequent time period t3 after the eight inverter delays. The time length between t2 and t3 is dependent on the delay caused by the even number of inverters cascaded in feedback circuit 34, and, as previously mentioned, can be lengthened or shortened by adding or subtracting inverter pairs.

At t2, when P-Channel pullup transistor 26 is turned off, the voltage at output node 14 does not immediately rise to a high logic level. P-channel leakage transistor 30 is a small device and can only provide a leakage current. By itself it is unable to instantaneously charge the capacitance load at output node 14 to a high logic level. When P-channel pullup transistor 26 is switched on at t3, the capacitive load at output node 14 is rapidly charged to a high logic level by P-Channel pullup transistor 26.

At a subsequent time period t4, the capacitive load at output node 14 is charged to a high logic level. At this time, the input signal to feedback circuit 34 switches from a low logic level to a high logic level, causing the output of feedback circuit 34 to be at a high logic level. Eight inverter delays later, the high logic level output of feedback circuit 34 causes P-Channel pullup transistor 26 to switch off, thereby returning the voltage of the capacitance load at output node 14 to its initial state during steady state time period t0.

Figure 3:
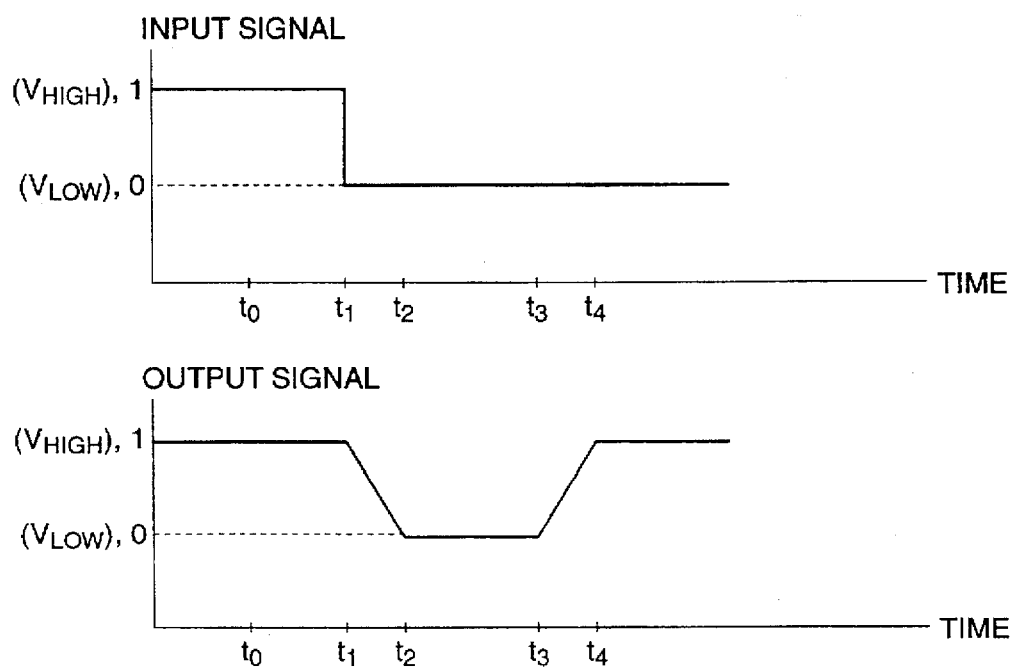
FIG. 3 is a timing diagram of the operation of the circuit of FIG. 1 when the input signal makes a transition from a high logic level to a low logic level.

The second condition to consider when analyzing the operation of the high current pulse generator circuit 10 is when the input signal to input node 12 makes a transition from a high logic level to a low logic level. Referring now to FIG. 3, a timing diagram will be useful when analyzing the operation of pulse generator circuit 10 as the input signal to input node 12 changes from a high logic level to a low logic level. During an initial steady state time period t0 where the input signal to input node 12 is a high logic level, the output signal of inverter 46 is also a high logic level because it has passed through an even number of inverters (the four inverters including 36, 42, 44, and 46). Since inverter 46 is driving a high logic level output into the gate of N-Channel pulldown transistor 18, N-Channel pulldown transistor 18 is switched on during this initial steady state period.

During this same steady state time period t0, the output signal of inverter 64 is a low logic level, since it has passed through an odd number of inverters (the seven inverters including 36, 42, 44, 46, 60, 62, and 64). Since inverter 64 is driving a low logic level output into the gate of N-Channel pulldown transistor 20, N-Channel pulldown transistor 20 is switched off during this initial steady state time period t0.

During time period t0, the output signal of inverter 80 is a low logic level, since it has passed through an odd number of inverters (the three inverters including 36, 78, and 80). Since inverter 80 is driving a low logic level output into the gate of N-Channel pulldown transistor 22, N-Channel pulldown transistor 22 is switched off during this initial steady state period.

In addition, during time period t0, the output signal of inverter 94 is a high logic level, since it has passed through an even number of inverters (the six inverters including 36, 78, 80, 90, 92, and 94). Since inverter 94 is driving a high logic level output into the gate of N-Channel pulldown transistor 24, N-Channel pulldown transistor 24 is switched on during this initial steady state period.

During this initial steady state time period t0 where the input signal to input node 12 is a high logic level, P-Channel leakage transistor 30 provides a leakage current for charging the output capacitance load (at output node 14) to a high logic level voltage output.

Since the output node 14 is driving a high logic level signal into the input of feedback circuit 34, feedback circuit 34 also has a high logic level output because it contains an even number of inverters. As mentioned previously, while eight inverters are shown in feedback circuit 34, those of ordinary skill in the art will recognize that the feedback delay can be either increased or decreased by adding or subtracting inverter pairs. Since the high logic level output of feedback circuit 34 is driven into the gate of P-Channel pullup transistor 26, P-Channel pullup transistor 26 is switched off during this initial steady state time period t0.

During a succeeding time period t1 occurring after initial steady state time period t0, a low logic level signal may be driven into input node 12 (see FIG. 3). This low logic level input signal propagates through the inverters driving N-Channel pulldown transistors 18, 20, 22, and 24. This signal first appears as a high logic signal at the output of inverter 80 after three inverter delays, where it switches on N-Channel pulldown transistor 22. After one inverter delay, the signal next appears at the output of inverter 46 as a low logic level signal, where it switches off N-Channel pulldown transistor 18. N-Channel pulldown transistor 20 continues to be switched off during time period t1, since the low logic level input signal driven into input node 12 is delayed by the additional three cascaded inverters 60, 62, and 64. N-Channel pulldown transistor 24 continues to be switched on during time period t1, since the low logic level input signal driven into input node 12 is delayed by cascaded inverters 90, 92, and 94.

Since N-Channel pulldown transistors 18 and 20 are switched off during time period t1, there is an open circuit disconnecting the series connected N-Channel pulldown transistors 18 and 20 from output node 14. However, since N-Channel pulldown transistors 22 and 24 are both switched on during time period t1, current conductance can occur from output node 14 to first supply voltage potential 16 (ground in FIG. 1), via the series connected N-Channel pulldown transistors 22 and 24. During time period t1, current is discharged through N-Channel pulldown transistors 22 and 24 from the capacitance load at output node 14. The capacitance load current discharge through N-Channel pulldown transistors 22 and 24 causes the output node 14 voltage to decrease to a low logic level.

At a subsequent time period t2 occurring three inverter delays after the output of inverter 80 goes to a high logic level, N-Channel pulldown transistor 24 is switched off, since the low logic level signal driven into input node 12 at time t1 would have reached the output of inverter 94 and gate of N-channel pulldown transistor 24 as a low logic level signal. Thus the time interval for the capacitive load discharge at output node 14 is dependent on the time delay caused by cascaded inverters 90, 92, and 94. Persons of ordinary skill in the art will recognize that the time interval for the discharge of the capacitive load at output node 14 can be lengthened or shortened by adding or subtracting inverter pairs.

During time period t2 when the voltage of the capacitive load is at a low logic level, the input signal into feedback circuit 34 is also at a low logic level because the feedback signal is delayed by eight inverter delays after N-Channel pulldown transistor 22 has turned on. P-Channel pullup transistor 26 will switch on at a subsequent time period t3 after the eight inverter delays. The time length between t2 and t3 is dependent on the delay caused by the even number of inverters cascaded in feedback circuit 34, and, as previously mentioned, can be lengthened or shortened by adding or subtracting inverter pairs.

At t2, when P-Channel pullup transistor 26 is turned off, the voltage at output node 14 does not immediately rise to a high logic level. P-Channel leakage transistor 30 is a small device and can only provide a leakage current. By itself it is unable to instantaneously charge the capacitance load at output node 14 to a high logic level. When P-Channel pullup transistor 26 is switched on at t3, the capacitive load at output node 14 is rapidly charged to a high logic level by P-Channel pullup transistor 26. The length of time the voltage at output node 14 is low is determined by the time length between t2 and t3. In other words, the width of the negative output pulse of pulse generator circuit 10 is determined by the number of inverters in feedback circuit 34

At a subsequent time period t4, the capacitive load at output node 14 is charged to a high logic level. At this time, the input signal to feedback circuit 34 switches from a low logic level to a high logic level, causing the output of feedback circuit 34 to be at a high logic level. Eight inverter delays later, the high logic level output of feedback circuit 34 causes P-Channel pullup transistor 26 to switch off, thereby returning the voltage of the capacitance load at output node 14 to its initial state during steady state time period t0.

Note also the high current pulse generator circuit 10 may be simplified further if it is necessary to obtain output node 14 voltages only from one of the input edges of a signal that is driven into input node 12. For example, if it is desired that the pulse generated at output node 14 be triggered as a result of a rising edge of a signal driven into input node 12, then N-Channel pulldown transistors 22 and 24 and inverters 78, 80, 90, 92 and 94 are not required in the invention disclosed above. If it is desired that the pulse generated at output node 14 be triggered as a result of a falling edge of a signal driven into input node 12, then N-Channel pulldown transistors 18 and 20 and inverters 42, 44, 46, 60, 62 and 64 are not required in the invention disclosed above.

High current pulse generator circuit 10 may be used for the precharge of large capacitance of buses in, for example, memory circuitry. In addition, to obtain pulses of positive polarity, a powerful inverter can be connected to output node 14.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A power short pulse generator for generating a pulse on a rising edge of an input signal comprising:

an input node;

an output node;

a first pulldown circuit and a second pulldown circuit connected in series between said output node and a first supply voltage potential, each of said first pulldown circuit and said second pulldown circuit having an input;

a pullup circuit connected between said output node and a second supply voltage potential, said pullup circuit having an input;

a leakage current circuit connected between said output node and said second supply voltage potential, said leakage current circuit configured to provide current for charging said output node;

a feedback delay circuit having a feedback circuit input connected to said output node and a feedback circuit output connected to said input of said pullup circuit, said feedback delay circuit having a first uninverted delay selected to provide an output pulse of a desired duration; and an input delay circuit connected between said input node and said input of said first pulldown circuit and said second pulldown circuit, said input delay circuit configured to provide a second uninverted delay between said input node and said input of said first pulldown circuit and to provide an inverted delay longer than said second uninverted delay between said input node and said input of said second pulldown circuit.

2. The power short pulse generator of claim 1 wherein said first pulldown circuit comprises a first N-Channel pulldown transistor having a drain connected to said output node, a source, and a gate connected to said input delay circuit;

wherein said second pulldown circuit comprises a second N-Channel pulldown transistor having a drain connected to said source of said first N-Channel pulldown transistor, a source connected to said first supply voltage potential, and a gate connected to said input delay circuit; and wherein said pullup circuit comprises a P-Channel pullup transistor having a drain connected to said output node, a source connected to said second supply voltage potential, and a gate connected to said feedback circuit output of said feedback delay circuit.

3. The power short pulse generator of claim 2 wherein said leakage current circuit comprises a P-Channel leakage transistor having a drain connected to said output node, a source connected to said second supply voltage potential, and a gate connected to said first supply voltage potential.

4. The power short pulse generator of claim 3 wherein said P-Channel leakage transistor has a channel width narrower than the respective channel widths of said P-Channel pullup transistor, said first N-Channel pulldown transistor, and said second N-Channel pulldown transistor.

5. The power short pulse generator of claim 1 wherein said feedback delay circuit comprises an even number of cascaded inverters connected between said feedback circuit input and said feedback circuit output, said even number selected to provide an output pulse of a desired duration.

6. The power short pulse generator of claim 1 wherein said input delay circuit comprises:

an even number of first cascaded inverters having an input connected to said input node and an output connected to said input of said first pulldown circuit; and an odd number of second cascaded inverters having an input connected to said input node and an output connected to said input of said second pulldown circuit, said odd number being larger than said even number and wherein said second cascaded inverters may include at least one inverter from said first cascaded inverters.

7. A power short pulse generator for generating a pulse on a rising edge of an input signal comprising:

an input node;

an output node;

a first N-Channel pulldown transistor having a drain connected to said output node, a source, and a gate;

a second N-Channel pulldown transistor having a drain connected to said source of said first N-Channel pulldown transistor, a source connected to a first supply voltage potential, and a gate;

a P-Channel pullup transistor having a drain connected to said output node, a source connected to a second supply voltage potential, and a gate;

a P-Channel leakage transistor having a drain connected to said output node, a source connected to said second supply voltage potential, and a gate connected to said first supply voltage potential;

a feedback delay circuit having an input connected to said output node and an output connected to said gate of said P-Channel pullup transistor, said feedback delay circuit having a first uninverted delay selected to provide an output pulse of a desired duration, said feedback delay circuit including a first group of eight cascaded inverters connected between said input of said feedback delay circuit and said output of said feedback delay circuit; and an input delay circuit connected between said input node and said gates of said first and second N-Channel pulldown transistors, said input delay circuit including a second group of four cascaded inverters having an input connected to said input node and an output connected to said gate of said first N-Channel pulldown transistor, and a third group of three cascaded inverters having an input connected to said output of said second group and an output connected to said gate of said second N-Channel pulldown transistor.

8. A power short pulse generator for generating a pulse on a falling edge of an input signal comprising:

an input node;

an output node;

a first pulldown circuit and a second pulldown circuit connected in series between said output node and a first supply voltage potential, each of said first pulldown circuit and said second pulldown circuit having an input;

a pullup circuit connected between said output node and a second supply voltage potential, said pullup circuit having an input;

a leakage current circuit connected between said output node and said second supply voltage potential, said leakage current circuit configured to provide current for charging said output node;

a feedback delay circuit having a feedback circuit input connected to said output node and a feedback circuit output connected to said input of said pullup circuit, said feedback delay circuit having a first uninverted delay selected to provide an output pulse of a desired duration; and an input delay circuit connected between said input node and said input of said first pulldown circuit and said second pulldown circuit, said input delay circuit configured to provide an inverted delay between said input node and said input of said first pulldown circuit and to provide a second uninverted delay longer than said inverted delay between said input node and said input of said second pulldown circuit.

9. The power short pulse generator of claim 8 wherein said first pulldown circuit comprises a first N-Channel pulldown transistor having a drain connected to said output node, a source, and a gate connected to said input delay circuit;

wherein said second pulldown circuit comprises a second N-Channel pulldown transistor having a drain connected to said source of said first N-Channel pulldown transistor, a source connected to said first supply voltage potential, and a gate connected to said input delay circuit; and wherein said pullup circuit comprises a P-Channel pullup transistor having a drain connected to said output node, a source connected to said second supply voltage potential, and a gate connected to said feedback circuit output of said feedback delay circuit.

10. The power short pulse generator of claim 9 wherein said leakage current circuit comprises a P-Channel leakage transistor having a drain connected to said output node, a source connected to said second supply voltage potential, and a gate connected to said first supply voltage potential.

11. The power short pulse generator of claim 10 wherein said P-Channel leakage transistor has a channel width narrower than the respective channel widths of said P-Channel pullup transistor, said first N-Channel pulldown transistor, and said second N-Channel pulldown transistor.

12. The power short pulse generator of claim 8 wherein said feedback delay circuit comprises an even number of cascaded inverters connected between said feedback circuit input and said feedback circuit output, said even number selected to provide an output pulse of a desired duration.

13. The power short pulse generator of claim 8 wherein said input delay circuit comprises:

an odd number of first cascaded inverters having an input connected to said input node and an output connected to said input of said first pulldown circuit; and an even number of second cascaded inverters having an input connected to said input node and an output connected to said input of said second pulldown circuit, said even number being larger than said odd number and wherein said second cascaded inverters may include at least one inverter from said first cascaded inverters.

14. A power short pulse generator for generating a pulse on a falling edge of an input signal comprising:

an input node;

an output node;

a first N-Channel pulldown transistor having a drain connected to said output node, a source, and a gate;

a second N-Channel pulldown transistor having a drain connected to said source of said first N-Channel pulldown transistor, a source connected to a first supply voltage potential, and a gate;

a P-Channel pullup transistor having a drain connected to said output node, a source connected to a second supply voltage potential, and a gate;

a P-Channel leakage transistor having a drain connected to said output node, a source connected to said second supply voltage potential, and a gate connected to said first supply voltage potential;

a feedback delay circuit having an input connected to said output node and an output connected to said gate of said P-Channel pullup transistor, said feedback delay circuit having a first uninverted delay selected to provide an output pulse of a desired duration, said feedback delay circuit including a first group of eight cascaded inverters connected between said input of said feedback delay circuit and said output of said feedback delay circuit; and an input delay circuit connected between said input node and the gates of said first and second N-Channel pulldown transistors, said input delay circuit including a second group of three cascaded inverters having an input connected to said input node and an output connected to said gate of said first N-Channel pulldown transistor, and a third group of three cascaded inverters having an input connected to the output of said second group and an output connected to said gate of said second N-Channel pulldown transistor.

15. A power short pulse generator for generating a pulse on a rising edge and falling edge of an input signal, comprising:

an input node;

an output node;

a first pulldown circuit and a second pulldown circuit connected in series between said output node and a first supply voltage potential, each of said first pulldown circuit and said second pulldown circuit having an input;

a third pulldown circuit and a fourth pulldown circuit connected in series between said output node and said first supply voltage potential, each of said third pulldown circuit and said fourth pulldown circuit having an input;

a pullup circuit connected between said output node and a second supply voltage potential, said pullup circuit having an input;

a leakage current circuit connected between said output node and said second supply voltage potential, said leakage current circuit configured to provide current for charging said output node;

a feedback delay circuit having a feedback circuit input connected to said output node and a feedback circuit output connected to said input of said pullup circuit, said feedback delay circuit having a first uninverted delay selected to provide an output pulse of a desired duration;

a first input delay circuit connected between said input node and said input of said first pulldown circuit and said second pulldown circuit, said first input delay circuit configured to provide a second uninverted delay between said input node and said input of said first pulldown circuit and to provide a first inverted delay longer than said second uninverted delay between said input node and said input of said second pulldown circuit; and a second input delay circuit connected between said input node and said input of said third pulldown circuit and said fourth pulldown circuit, said second input delay circuit configured to provide a second inverted delay between said input node and said input of said third pulldown circuit and to provide a third uninverted delay longer than said second inverted delay between said input node and said input of said fourth pulldown circuit.

16. The power short pulse generator of claim 15 wherein said first pulldown circuit comprises a first N-Channel pulldown transistor having a drain connected to said output node, a source, and a gate connected to said first input delay circuit;

wherein said second pulldown circuit comprises a second N-Channel pulldown transistor having a drain connected to said source of said first N-Channel pulldown transistor, a source connected to said first supply voltage potential, and a gate connected to said first input delay circuit;

wherein said third pulldown circuit comprises a third N-Channel pulldown transistor having a drain connected to said output node, a source, and a gate connected to said second input delay circuit;

wherein said fourth pulldown circuit comprises a fourth N-Channel pulldown transistor having a drain connected to said source of said third N-Channel pulldown transistor, a source connected to said first supply voltage potential, and a gate connected to said second input delay circuit; and wherein said pullup circuit comprises a P-Channel pullup transistor having a drain connected to said output node, a source connected to said second supply voltage potential, and a gate connected to said feedback circuit output of said feedback delay circuit.

17. The power short pulse generator of claim 16 wherein said leakage current circuit comprises a P-Channel leakage transistor having a drain connected to said output node, a source connected to said second supply voltage potential, and a gate connected to said first supply voltage potential.

18. The power short pulse generator of claim 17 wherein said P-Channel leakage transistor has a channel width narrower than the respective channel widths of said P-Channel pullup transistor, said first N-Channel pulldown transistors, said second N-Channel pulldown transistor, said third N-Channel pulldown transistor, and said fourth N-Channel pulldown transistor.

19. The power short pulse generator of claim 15 wherein said feedback delay circuit comprises an even number of cascaded inverters connected between said feedback circuit input and said feedback circuit output, said even number selected to provide an output pulse of a desired duration.

20. The power short pulse generator of claim 15 wherein said first input delay circuit comprises:

an even number of first cascaded inverters having an input connected to said input node and an output connected to said input of said first pulldown circuit;

an odd number of second cascaded inverters having an input connected to said input node and an output connected to said input of said second pulldown circuit, said second cascaded inverters being larger than said first cascaded inverters, and wherein said second cascaded inverters may include at least one inverter from said first cascaded inverters;

and further wherein said second input delay circuit comprises:

an odd number of third cascaded inverters having an input connected to said input node and an output connected to said input of said third pulldown circuit; and an even number of fourth cascaded inverters having an input connected to said input node and an output connected to said input of said fourth pulldown circuit, said fourth cascaded inverters being larger than said third cascaded inverters and wherein said fourth cascaded inverters may include at least one inverter from said third cascaded inverters.

21. A power short pulse generator for generating a pulse on a rising edge and falling edge of an input signal, comprising:

an input node;

an output node;

a first N-Channel pulldown transistor having a drain connected to said output node, a source, and a gate;

a second N-Channel pulldown transistor having a drain connected to said source of said first N-Channel pulldown transistor, a source connected to a first supply voltage potential, and a gate;

a third N-Channel pulldown transistor having a drain connected to said output node, a source, and a gate;

a fourth N-Channel pulldown transistor having a drain connected to said source of said third N-Channel pulldown transistor, a source connected to said first supply voltage potential, and a gate;

a P-Channel pullup transistor having a drain connected to said output node, a source connected to a second supply voltage potential, and a gate;

a P-Channel leakage transistor having a drain connected to said output node, a source connected to said second supply voltage potential, and a gate connected to said first supply voltage potential;

a feedback delay circuit having an input connected to said output node and an output connected to said gate of said P-Channel pullup transistor, said feedback delay circuit having a first uninverted delay selected to provide an output pulse of a desired duration, said feedback delay circuit including a first group of eight cascaded inverters connected between said input of said feedback delay circuit and said output of said feedback delay circuit;

a first input delay circuit connected between said input node and the gates of said first and second N-Channel pulldown transistors, said first input delay circuit including a second group of four cascaded inverters having an input connected to said input node and an output connected to said gate of said first N-Channel pulldown transistor, and a third group of three cascaded inverters having an input connected to said output of said second group and an output connected to the gate of said second N-Channel pulldown transistor; and a second input delay circuit connected between said input node and the gates of said third and fourth N-Channel pulldown transistors, said second input delay circuit including a fourth group of three cascaded inverters having an input connected to said input node and an output connected to said gate of said third N-Channel pulldown transistor, and a fifth group of three cascaded inverters having an input connected to said output of said fourth group and an output connected to said gate of said fourth N-Channel pulldown transistor.

22. A method for generating a pulse on a rising edge of an input signal, comprising the steps of:

providing a circuit including:

an input node;

an output node;

a first pulldown circuit and a second pulldown circuit connected in series between said output node and a first supply voltage potential, each of said first pulldown circuit and said second pulldown circuit having an input;

a pullup circuit connected between said output node and a second supply voltage potential, said pullup circuit having an input;

a leakage current circuit connected between said output node and said second supply voltage potential, said leakage current circuit configured to provide current for charging said output node;

a feedback delay circuit having a feedback circuit input connected to said output node and a feedback circuit output connected to said input of said pullup circuit, said feedback delay circuit having a first uninverted delay selected to provide an output pulse of a desired duration;

an input delay circuit connected between said input node and said input of said first pulldown circuit and said second pulldown circuit, said input delay circuit configured to provide a second uninverted delay between said input node and said input of said first pulldown circuit and to provide an inverted delay longer than said second uninverted delay between said input node and said input of said second pulldown circuit; and providing an input signal having the rising edge to said input node of said circuit so as to generate the pulse at said output node.

23. The method of claim 22 wherein said first pulldown circuit comprises a first N-Channel pulldown transistor having a drain connected to said output node, a source, and a gate connected to said input delay circuit;

wherein said second pulldown circuit comprises a second N-Channel pulldown transistor having a drain connected to said source of said first N-Channel pulldown transistor, a source connected to said first supply voltage potential, and a gate connected to said input delay circuit; and wherein said pullup circuit comprises a P-Channel pullup transistor having a drain connected to said output node, a source connected to said second supply voltage potential, and a gate connected to said feedback circuit output of said feedback delay circuit.

24. The method of claim 23 wherein said leakage current circuit comprises a P-Channel leakage transistor having a drain connected to said output node, a source connected to said second supply voltage potential, and a gate connected to said first supply voltage potential.

25. The method of claim 24 wherein said P-Channel leakage transistor has a channel width narrower than the respective channel widths of said P-Channel pullup transistor, said first N-Channel pulldown transistor, and said second N-Channel pulldown transistor.

26. The method of claim 22 wherein said feedback delay circuit comprises an even number of cascaded inverters connected between said feedback circuit input and said feedback circuit output, said even number selected to provide an output pulse of a desired duration.

27. The method of claim 22 wherein said input delay circuit comprises: an even number of first cascaded inverters having an input connected to said input node and an output connected to said input of said first pulldown circuit; and an odd number of second cascaded inverters having an input connected to said input node and an output connected to said input of said second pulldown circuit, said odd number being larger than said even number and wherein said second cascaded inverters may include at least one inverter from said first cascaded inverters.

28. A method for generating a pulse on a falling edge of an input signal, comprising the steps of:

providing a circuit including:

an input node;

an output node;

a first pulldown circuit and a second pulldown circuit connected in series between said output node and a first supply voltage potential, each of said first pulldown circuit and said second pulldown circuit having an input;

a pullup circuit connected between said output node and a second supply voltage potential, said pullup circuit having an input;

a leakage current circuit connected between said output node and said second supply voltage potential, said leakage current circuit configured to provide current for charging said output node;

a feedback delay circuit having a feedback circuit input connected to said output node and a feedback circuit output connected to said input of said pullup circuit, said feedback delay circuit having a first uninverted delay selected to provide an output pulse of a desired duration;

an input delay circuit connected between said input node and said input of said first pulldown circuit and said second pulldown circuit, said input delay circuit configured to provide an inverted delay between said input node and said input of said first pulldown circuit and to provide a second uninverted delay longer than said inverted delay between said input node and said input of said second pulldown circuit; and providing an input signal having the falling edge to said input node of said circuit so as to generate the pulse at said output node.

29. The method of claim 28 wherein said first pulldown circuit comprises a first N-Channel pulldown transistor having a drain connected to said output node, a source, and a gate connected to said input delay circuit;

wherein said second pulldown circuit comprises a second N-Channel pulldown transistor having a drain connected to said source of said first N-Channel pulldown transistor, a source connected to said first supply voltage potential, and a gate connected to said input delay circuit; and wherein said pullup circuit comprises a P-Channel pullup transistor having a drain connected to said output node, a source connected to said second supply voltage potential, and a gate connected to said feedback circuit output of said feedback delay circuit.

30. The method of claim 29 wherein said leakage current circuit comprises a P-Channel leakage transistor having a drain connected to said output node, a source connected to said second supply voltage potential, and a gate connected to said first supply voltage potential.

31. The method of claim 30 wherein said P-Channel leakage transistor has a channel width narrower than the respective channel widths of said P-Channel pullup transistor, said first N-channel pulldown transistor, and said second N-Channel pulldown transistor.

32. The method of claim 28 wherein said feedback delay circuit comprises an even number of cascaded inverters connected between said feedback circuit input and said feedback circuit output, said even number selected to provide an output pulse of a desired duration.

33. The method of claim 28 wherein said input delay circuit comprises:

an odd number of first cascaded inverters having an input connected to said input node and an output connected to said input of said first pulldown circuit; and an even number of second cascaded inverters having an input connected to said input node and an output connected to said input of said second pulldown circuit, said even number being larger than said odd number and wherein said second cascaded inverters may include at least one inverter from said first cascaded inverters.

34. A method for generating a pulse on a rising edge and falling edge of an input signal, comprising the steps of:

providing a circuit including:
an input node;
an output node;
a first pulldown circuit and a second pulldown circuit connected in series between said output node and a first supply voltage potential, each of said first pulldown circuit and said second pulldown circuit having an input;
a third pulldown circuit and a fourth pulldown circuit connected in series between said output node and said first supply voltage potential, each of said third pulldown circuit and said fourth pulldown circuit having an input;

a pullup circuit connected between said output node and a second supply voltage potential, said pullup circuit having an input;

a leakage current circuit connected between said output node and said second supply voltage potential, said leakage current circuit configured to provide current for charging said output node;

a feedback delay circuit having a feedback circuit input connected to said output node and a feedback circuit output connected to said input of said pullup circuit, said feedback delay circuit having a first uninverted delay selected to provide an output pulse of a desired duration;

a first input delay circuit connected between said input node and said input of said first pulldown circuit and said second pulldown circuit, said first input delay circuit configured to provide a second uninverted delay between said input node and said input of said first pulldown circuit and to provide a first inverted delay longer than said second uninverted delay between said input node and said input of said second pulldown circuit;

a second input delay circuit connected between said input node and said input of said third pulldown circuit and said fourth pulldown circuit, said second input delay circuit configured to provide a second inverted delay between said input node and said input of said third pulldown circuit and to provide a third uninverted delay longer than said second inverted delay between said input node and said input of said fourth pulldown circuit; and providing an input signal having the rising edge and falling edge to said input node of said circuit so as to generate the pulse at said output node.

35. The method of claim 34 wherein said first pulldown circuit comprises a first N-Channel pulldown transistor having a drain connected to said output node, a source, and a gate connected to said first input delay circuit;

wherein said second pulldown circuit comprises a second N-Channel pulldown transistor having a drain connected to said source of said first N-Channel pulldown transistor, a source connected to said first supply voltage potential, and a gate connected to said first input delay circuit;

wherein said third pulldown circuit comprises a third N-Channel pulldown transistor having a drain connected to said output node, a source, and a gate connected to said second input delay circuit;

wherein said fourth pulldown circuit comprises a fourth N-Channel pulldown transistor having a drain connected to said source of said third N-Channel pulldown transistor, a source connected to said first supply voltage potential, and a gate connected to said second input delay circuit; and wherein said pullup circuit comprises a P-Channel pullup transistor having a drain connected to said output node, a source connected to said second supply voltage potential, and a gate connected to said feedback circuit output of said feedback delay circuit.

36. The method of claim 35 wherein said leakage current circuit comprises a P-Channel leakage transistor having a drain connected to said output node, a source connected to said second supply voltage potential, and a gate connected to said first supply voltage potential.

37. The method of claim 36 wherein said P-Channel leakage transistor has a channel width narrower than the respective channel widths of said P-Channel pullup transistor, said first N-Channel pulldown transistors, said second N-Channel pulldown transistor, said third N-Channel pulldown transistor, and said fourth N-Channel pulldown transistor.

38. The method of claim 34 wherein said feedback delay circuit comprises an even number of cascaded inverters connected between said feedback circuit input and said feedback circuit output, said even number selected to provide an output pulse of a desired duration.

39. The method of claim 34 wherein said first input delay circuit comprises:

a first group of cascaded inverters having an input connected to said input node and an output connected to said input of said first pulldown circuit, said first group having an even number of inverters;

a second group of cascaded inverters having an input connected to said input node and an output connected to said input of said second pulldown circuit, said second group having an odd number of inverters, said second group being larger than said first group, and wherein said second group may include at least one inverter from said first group;

and further wherein said second input delay circuit comprises:

a third group of cascaded inverters having an input connected to said input node and an output connected to said input of said third pulldown circuit, said third group having an odd number of inverters; and a fourth group of cascaded inverters having an input connected to said input node and an output connected to said input of said fourth pulldown circuit, said fourth group being larger than said third group, and wherein said fourth group may include at least one inverter from said third group.

40. A method for generating a pulse on an output node in response to a rising edge of an input signal on an input node, comprising the steps of:

generating a first delay in response to the rising edge of the input signal on the input node;

generating a second delay in response to said rising edge of said input signal on said input node;

pulling down said output node in response to said first delay, said pulling down step occurring between said first delay and said second delay;

generating a delayed feedback signal in response to said pulling down step; and pulling up said output node in response to said delayed feedback signal.

41. The method of claim 40 wherein the step of generating said first delay includes providing an even number of first cascaded inverters to drive a first pulldown switch in response to said rising edge of said input signal on said input node.

42. The method of claim 40 wherein the step of generating said second delay includes providing an odd number of second cascaded inverters to drive a second pulldown switch in response to said rising edge of said input signal on said input node.

43. The method of claim 40 wherein the step of generating said delayed feedback signal includes providing an even number of third cascaded inverters to drive a pullup switch in response to said pulling down step, said third cascaded inverters connected between said output node and said pullup switch.

44. A method for generating a pulse on an output node in response to a falling edge of an input signal on an input node, comprising the steps of:

generating a first delay in response to the falling edge of the input signal on the input node;

generating a second delay in response to said falling edge of said input signal on said input node;

pulling down said output node in response to said first delay, said pulling down step occurring between said first delay and said second delay;

generating a delayed feedback signal in response to said pulling down step; and pulling up said output node in response to said delayed feedback signal.

45. The method of claim 44 wherein the step of generating said first delay includes providing an odd number of first cascaded inverters to drive a first pulldown switch in response to said falling edge of said input signal on said input node.

46. The method of claim 44 wherein the step of generating said second delay includes providing an even number of second cascaded inverters to drive a second pulldown switch in response to said falling edge of said input signal on said input node.

47. The method of claim 44 wherein the step of generating said delayed feedback signal includes providing an even number of third cascaded inverters to drive a pullup switch in response to said pulling down step, said third cascaded inverters connected between said output node and said pullup switch.

48. A method for generating a pulse on an output node in response to a rising edge and falling edge of an input signal on an input node, comprising the steps of:

generating a first delay in response to the rising edge of the input signal on the input node;

generating a second delay in response to said rising edge of said input signal on said input node;

generating a third delay in response to said falling edge of said input signal on said input node;

generating a fourth delay in response to said falling edge of said input signal on said input node;

pulling down said output node in response to said first delay and said third delay, said pulling down step occurring between said first delay and said second delay, and between said third delay and said fourth delay;

generating a delayed feedback signal in response to said pulling down step; and pulling up said output node in response to said delayed feedback signal.

49. The method of claim 48 wherein the step of generating said first delay includes providing an even number of first cascaded inverters to drive a first pulldown switch in response to said rising edge of said input signal on said input node.

50. The method of claim 48 wherein the step of generating said second delay includes providing an odd number of second cascaded inverters to drive a second pulldown switch in response to said rising edge of said input signal on said input node.

51. The method of claim 48 wherein the step of generating said third delay includes providing an odd number of third cascaded inverters to drive a third pulldown switch in response to said falling edge of said input signal on said input node.

52. The method of claim 48 wherein the step of generating said fourth delay includes providing an even number of fourth cascaded inverters to drive a fourth pulldown switch in response to said falling edge of said input signal on said input node.

53. The method of claim 48 wherein the step of generating said delayed feedback signal includes providing an even number of fifth cascaded inverters to drive a pullup switch in response to said pulling down step, said fifth cascaded inverters connected between said output node and said pullup switch.

54. A power short pulse generator for generating a pulse on an output node in response to a rising edge on an input signal on an input node, comprising:

means for generating a first delay in response to the rising edge of the input signal on the input node;

means for generating a second delay in response to said rising edge of said input signal on said input node;

means for pulling down said output node in response to said first delay, said pulling down of said output node occurring between said first delay and said second delay;

means for generating a delayed feedback signal in response to said pulling down of said output node; and means for pulling up said output node in response to said delayed feedback signal.

55. The power short pulse generator of claim 54 wherein said means for generating said first delay comprises an even number of first cascaded inverters connected between said input node and said means for pulling down said output node.

56. The power short pulse generator of claim 54 wherein said means for generating said second delay comprises an odd number of second cascaded inverters connected between said input node and said means for pulling down said output node, said odd number being larger than said even number, and wherein said second cascaded inverters may include at least one inverter from said first cascaded inverters.

57. The power short pulse generator of claim 54 wherein said means for pulling down said output node comprises:

a first pulldown switch connected to said output node and said means for generating said first delay; and a second pulldown switch connected to said first pulldown switch, said means for generating said second delay, and a first supply voltage potential.

58. The power short pulse generator of claim 54 wherein said means for generating said delayed feedback signal comprises an even number of cascaded inverters connected between said output node and said means for pulling up said output node, said even number selected to provide an output pulse of a desired duration.

59. The power short pulse generator of claim 54 wherein said means for pulling up said output node comprises a pullup switch connected to said output node, said means for generating said delayed feedback signal, and a second supply voltage potential.

60. A power short pulse generator for generating a pulse on an output node in response to a falling edge on an input signal on an input node, comprising:

means for generating a first delay in response to the falling edge of the input signal on the input node;

means for generating a second delay in response to said falling edge of said input signal on said input node;

means for pulling down said output node in response to said first delay, said pulling down of said output node occurring between said first delay and said second delay;

means for generating a delayed feedback signal in response to said pulling down of said output node; and means for pulling up said output node in response to said delayed feedback signal.

61. The power short pulse generator of claim 60 wherein said means for generating said first delay comprises an odd number of first cascaded inverters connected between said input node and said means for pulling down said output node.

62. The power short pulse generator of claim 60 wherein said means for generating said second delay comprises an even number of second cascaded inverters connected between said input node and said means for pulling down said output node, said even number being larger than said odd number, and wherein said second cascaded inverters may include at least one inverter from said first cascaded inverters.

63. The power short pulse generator of claim 60 wherein said means for pulling down said output node comprises:

a first pulldown switch connected to said output node and said means for generating said first delay; and a second pulldown switch connected to said first pulldown switch, said means for generating said second delay, and a first supply voltage potential.

64. The power short pulse generator of claim 60 wherein said means for generating said delayed feedback signal comprises an even number of cascaded inverters connected between said output node and said means for pulling up said output node, said even number selected to provide an output pulse of a desired duration.

65. The power short pulse generator of claim 60 wherein said means for pulling up said output node comprises a pullup switch connected to said output node, said means for generating said delayed feedback signal, and a second supply voltage potential.

66. A power short pulse generator for generating a pulse on an output node in response to a rising edge and falling edge of an input signal on an input node, comprising:

means for generating a first delay in response to the rising edge of the input signal on the input node;

means for generating a second delay in response to said rising edge of said input signal on said input node;

means for generating a third delay in response to said falling edge of said input signal on said input node;

means for generating a fourth delay in response to said falling edge of said input signal on said input node;

means for pulling down said output node in response to said first delay and said third delay, said pulling down occurring between said first delay and said second delay, and between said third delay and said fourth delay;

means for generating a delayed feedback signal in response to said pulling down of said output node; and means for pulling up said output node in response to said delayed feedback signal.

67. The power short pulse generator of claim 66 wherein said means for generating said first delay comprises an even number of first cascaded inverters connected between said input node and said means for pulling down said output node.

68. The power short pulse generator of claim 66 wherein said means for generating said second delay comprises an odd number of second cascaded inverters connected between said input node and said means for pulling down said output node, said second cascaded inverters being larger than said first cascaded inverters, and wherein said second cascaded inverters may include at least one inverter from said first cascaded inverters.

69. The power short pulse generator of claim 66 wherein said means for generating said third delay comprises an odd number of third cascaded inverters connected between said input node and said means for pulling down said output node.

70. The power short pulse generator of claim 66 wherein said means for generating said fourth delay comprises an even number of fourth cascaded inverters connected between said input node and said means for pulling down said output node, said fourth cascaded inverters being larger than said third cascaded inverters, and wherein said fourth cascaded inverters may include at least one inverter from said third cascaded inverters.

71. The power short pulse generator of claim 66 wherein said means for pulling down said output node comprises:

a first pulldown switch connected to said output node and said means for generating said first delay;

a second pulldown switch connected to said first pulldown switch, said means for generating said second delay, and a first supply voltage potential;

a third pulldown switch connected to said output node and said means for generating said third delay; and a fourth pulldown switch connected to said third pulldown switch, said means for generating said fourth delay, and said first supply voltage potential.

72. The power short pulse generator of claim 66 wherein said means for generating said delayed feedback signal comprises an even number of cascaded inverters connected between said output node and said means for pulling up said output node, said even number selected to provide an output pulse of a desired duration.

73. The power short pulse generator of claim 66 wherein said means for pulling up said output node comprises a pullup switch connected to said output node, said means for generating said delayed feedback signal, and a second supply voltage potential.

* * * * *

UNITED STATES PATENT AND TRADEMARK OFFICE
CERTIFICATE OF CORRECTION

PATENT NO. : 5,731,724
DATED : March 24, 1998
INVENTOR(S) : Gennady Ivanovich Grishakov, Igor Vladimirovich Tarasov It is certified that error appears in the above-identified patent and that said Letters Patent is hereby corrected as shown below:

On column 3, line 10, between "t0" and "where", please insert a space.
On column 4, line 34, please replace "18 and" with --18 and 20--.
In claim 56, column 19, line 31, please replace "claim 54" with --claim 55--.
In claim 62, column 20, line 10, please replace "claim 60" with --claim 61--.
In claim 68, column 20, line 63, please replace "claim 66" with --claim 67--.
In claim 70, column 21, line 9, please replace "claim 66" with --claim 69--.

Signed and Sealed this

FourthDay of August, 1998

*Attest:*

*Attesting Officer*

BRUCE LEHMAN

*Commissioner of Patents and Trademarks*